United States Patent [19]

McCune et al.

[11] Patent Number: 4,919,974

[45] Date of Patent: Apr. 24, 1990

[54] MAKING DIAMOND COMPOSITE COATED CUTTING TOOLS

[75] Inventors: Robert C. McCune, Birmingham; Ronald J. Baird, Livonia, both of Mich.

[73] Assignee: Ford Motor Company, Dearborn, Mich.

[21] Appl. No.: 296,263

[22] Filed: Jan. 12, 1989

[51] Int. Cl.$^5$ .............................................. C23G 16/00
[52] U.S. Cl. ...................................... 427/249; 51/293; 427/38; 427/39; 427/122
[58] Field of Search ................ 51/293, 295, 308, 309; 427/38, 39, 122, 249

[56] References Cited

U.S. PATENT DOCUMENTS

| | | | |
|---|---|---|---|
| 3,517,464 | 6/1970 | Mattia et al. | 51/293 |
| 3,639,151 | 2/1972 | Krutenat | 427/39 |
| 3,961,103 | 6/1976 | Aisenberg | 427/39 |
| 4,260,397 | 4/1981 | Bovenkerk | 51/293 |
| 4,505,721 | 3/1985 | Almond et al. | 51/293 |
| 4,707,384 | 11/1987 | Schachner et al. | 427/249 |
| 4,752,504 | 6/1988 | Rickborn | 427/249 |
| 4,756,964 | 7/1988 | Kincaid et al. | 427/249 |
| 4,761,308 | 8/1988 | Gebhardt et al. | 427/249 |
| 4,766,007 | 8/1988 | Kurokawa | 427/39 |
| 4,825,049 | 4/1989 | Rickborn | 427/249 |
| 4,849,249 | 7/1989 | Ishihara et al. | 427/39 |

*Primary Examiner*—Paul Lieberman
*Assistant Examiner*—Willie J. Thompson
*Attorney, Agent, or Firm*—Joseph W. Malleck; Roger L. May

[57] ABSTRACT

Method of making a composite coated article by the steps of: (a) initiating chemical vapor deposition of separated diamond or diamond-like particles onto a nondiamond or nondiamond-like substrate surface by use of low pressure metastable deposition of carbon in the presence of atomic hydrogen and at a temperature (i.e., 600°–950° C.) that favors the nucleation of such particles, the substrate being selected to retain its strength related properties after said chemical vapor deposition (ie., SiAlON, $Si_3N_4$, SiC, Si, Ti, Co cemented WC, TiC, Ni-Mo cemented TiCN); (b) substantially suppressing nucleation of additional particles (heating to above about 1000° C.) before formation of a contiguous film of said particles while permitting the existing particles to grow to a predetermined maximum crystal size consistent with separated crystals; and (c) depositing a mechanically tough, diamond and substrate-wetting metal binding material (i.e., Ti, Ni, Co, Mn, Cr, Mo, Fe) onto and across said separaed particles and exposed substrate surface to form the composite coated article. Chemical vapor deposition comprises thermal decomposition (i.e., microwave plasma, discharge, filament heating) of a hydrocarbon gas containing hydrogen, with or without diamond seeding. The binding material preferably contains a brazing agent (i.e., Cu, Ag, Sn).

22 Claims, 5 Drawing Sheets

```
┌─────────────────────────────────────────┐
│ Initiating CVD of separated diamond or  │
│ diamond-like particles onto a           │
│ nondiamond or nondiamond-like substrate │
│ surface by use of low pressure          │
│ metastable deposition of carbon in the  │
│ presence of atomic hydrogen and at a    │
│ substrate temperature that favors the   │
│ nucleation of such particles, the       │
│ substrate being selected to retain its  │
│ strength related properties after CVD   │
└─────────────────────────────────────────┘
                    │
┌─────────────────────────────────────────┐
│ substantially suppressing nucleation of │
│ additional particles before formation   │
│ of a contiguous film of said particles  │
│ while permitting the existing particles │
│ to grow to a predetermined maximum crystal │
│ size consistent with separated crystals │
└─────────────────────────────────────────┘
                    │
┌─────────────────────────────────────────┐
│ adhering a mechanically tough, diamond and │
│ substrate-wetting, metal binding material │
│ onto and across said separated particles │
│ and exposed substrate surface to form the │
│ composite coated article with little or no │
│ graphitization of said particles.       │
└─────────────────────────────────────────┘
```

*Fig. 1*

MAKING DIAMOND COMPOSITE COATED CUTTING TOOLS

BACKGROUND OF THE INVENTION

1. Technical Field

This invention relates to the art of synthesizing diamond and hard carbon films and, more particularly, to the art of adhering such films to the working surface of cutting or forming tools.

2. Discussion of the Prior Art

The synthesis of diamond under high pressure and high temperature conditions (HPHT) is a well-known success, originating with its announcement in 1955; several tons of industrial diamond abrasive grain are made this way each year in various factories around the world (see R. H. Wentorf, R. C. DeVries, and F. P. Bundy, "Sintered Superhard Materials", *Science*, Vol. 208, p. 873 (1980); and J. C. Walmsley, "The Microstructure of Ultrahard Material Compacts Studied by Transmission Electron Microscopy", Proceedings of International Conference on Science of Hard Materials, Nassau, Bahamas, November 1987). Unfortunately, current HPHT synthesis schemes do not permit direct coating of tool materials without detrimentally affecting such tool materials; the cost, inability to cover large areas, and complexity of making controlled diamond by this process is high.

Only in the last few years has it been possible to produce diamond crystals by low pressure chemical vapor deposition (CVD) The possibility of synthesis of diamond under metastable conditions, i.e., in the graphite stable region, is based on the small free energy difference between diamond and graphite under ambient conditions. By using atomic hydrogen during such synthesis, diamond will be favored to deposit from a hydrocarbon vapor. The presence of atomic hydrogen appears to be the key ingredient because it removes graphite or prevents its formation while promoting the crystallization of diamond in the metastable state (see R. Messier, K. E. Spear, A. R. Badzian, and R. Roy, "The Quest For Diamond Coatings", *Journal of Metals*, Vol. 39 [No. 9], page 8, (1987); and R. C. DeVries, "Synthesis Of Diamond Under Metastable Conditions", *Annual Reviews of Materials Science*, Vol. 17, page 161, (1987)). The conversion process, assisted by the use of a variety of thermal techniques including heated filaments and microwave plasma can be considered for use on some tool materials.

In all of the early investigations, there was little concern for micromorphology and adhesion to a substrate. In later investigations, it was observed that crystals appeared more readily at scratches on the substrate; such substrates were formed of materials familiar to the semiconductor art, such as silicon, copper, tungsten, and molybdenum (see Y. Mitsuda, Y. Kojima, T. Yoshida and K. Akashi, "The Growth Of Diamond In Microwave Plasma Under Low Pressure", *Journal of Materials Science*, Vol. 22, page 1557 (1987); B. V. Spitsyn, L. L. Bouilov and B. V. Derjaguin, "Vapor Growth Of Diamond On Diamond And Other Surfaces", *Journal of Crustal Growth*, Vol. 52, page 219 (1981); S. Matsumoto, Y. Sato, M. Tsutsumi and S. Setaka, "Growth Of Diamond Particles From Methane-Hydrogen Gas", *Journal of Materials Science*, Vol. 17, page 3106 (1982); and A. R. Badzian, T. Badzian, R. Roy, R. Messier and K. E. Spear, "Crystalization Of Diamond Crystals And Films By Microwave Assisted CVD (Part II)", *Materials Research Bulletin*, Vol. 23, page 531 (1988)).

When research investigators turned their attention to the adhesion of diamond coatings to a substrate, such as for cutting tools, they found the coatings suffered (see Y. Yagi, K. Shibuki and T. Takatsu, "Adhesion Strength Of Diamond Films On Cemented Carbide Substrate", presented at the 15th International Conference on Metallurgical Coatings, Apr. 11–15, San Diego, Calif. (1988)).

In their efforts, the wettability of metals to diamond has been investigated. The affinity of titanium, nickel, cobalt, manganese, chromium, molybdenum, and iron is made evident by such works as: Yu. V. Naidich and G. A. Kolesnichenko, "Study of the Wetting of Diamond and Graphite by Liquid Metals II. Angles of Contact and Adhesion Between Tin-Titanium and Copper-Tin-Titanium Alloys and the Graphite Surface", *Poroshkovaya Metallurgiya* 1 (13) p. 49 (1963); Yu. V. Naidich and G. A. Kolesnichenko, "Investigation of the Wetting of Diamond and Graphite by Molten Metals and Alloys III. The Wetting of Diamond Crystals", *Poroshkovaya Metallurgiya* 3 (21) p. 23 (1964); Yu. V. Naidich and G.A. Kolesnichenko, "Investigation of the Wetting of Diamond and Graphite by Molten Metals and Alloys IV. Influence of Temperature on the Adhesion of Metals Inert to Carbon", *Poroshkovaya Metallurgiya* 2 (38) p. 97 (1966); and Yu. V. Naidich and G. A. Kolesnichenko, "Investigation of the Wetting of Diamond and Graphite by Molten Metals and Alloys V. Carbide Formation Kinetics at the Graphite/Metallic Melt Interface", *Poroshkovaya Metallurgiya* 2, p. 76 February 1968. To effect wetting, the above investigations heated the materials to above 1100° C. for time periods of at least 10 minutes duration. Such heating would promote graphitization or dissolution of thin diamond coatings and thus makes the results of such investigations not usable for promoting improved diamond-coated tools. If such wetting metals were deposited by chemical vaporization techniques, the temperature of processing (above 600° C.) for a necessary period of time (i.e., 30 minutes) would cause graphitization and/or dissolution of deposited diamond or diamond-like particles (see J. A. Sheward and W. J. Young, "The Deposition of Molybdenum and Tungsten Coatings on Gun Steel Substrates by Plasma Assisted CVD Process", *Vacuum*, Vol. 36, p. 37 (1986).

The knowledge gained from these investigations has not been applied and is not sufficient to overcome the problems facing developers of industrially-robust diamond-coated tools. The first of these is the nature of the CVD process which requires that the substrate be subjected to a temperature of about 1000° C. which basically eliminates the use of many types of tool substrates and restricts the selection to high temperature resistant substrates that generally are not strong in tension. A second problem involves adherence and mechanical strength of the coating in contact with the supporting substrate. There are very few substrate materials, and almost none commercially, which can tolerate both the high temperatures of the current deposition process as well as provide sufficient mechanical support to sustain the internal stresses which are developed in a contiguous diamond film due to the exceptionally low coefficient of thermal expansion of diamond and its usually extremely high modulus of elasticity.

SUMMARY OF THE INVENTION

The method of this invention provides an economical process for improving the adhesion of diamond crystals to tool substrates while accommodating varying physical properties of the substrate. The method comprises making a composite coated tool by the steps of: (a) initiating chemical vapor deposition of separated diamond or diamond-like particles onto a nondiamond or nondiamond-like substrate surface by use of low pressure metastable deposition of carbon in the presence of atomic hydrogen and at a temperature that favors the nucleation of such particles, the substrate being selected to facilitate such diamond or diamond-like deposition (i.e., substrate constituted of a carbide or carbide former), and retain its strength related properties after such chemical vapor deposition (the particles each being formed from a nucleus of four-coordinated carbon atoms with $sp^3$ bonding); (b) substantially suppressing nucleation of additional particles before formation of a contiguous film of such particles takes place, while permitting the existing particles to grow to a predetermined maximum crystal size consistent with separated crystals; and (c) adhering a mechanically tough, diamond and substrate-wetting, metal binding material onto and across said separated particles and exposed substrate surface to form the composite coated tool with little or no graphitization or dissolution of the particles.

The chemical vapor deposition of the diamond or diamond-like particles comprises metastable thermal decomposition of a hydrocarbon gas containing hydrogen (such as 0.5% by volume methane and the remainder essentially hydrogen). Such deposition may be carried out with the use of heterogeneous diamond seeding on the surface or by homogeneous carburizing nucleation directly onto the surface. The presence of atomic hydrogen from such gas is facilitated such as by microwave plasma discharge heating or by filament heating. Nucleation is assured by maintaining the substrate temperature in the range of 600°–950° C. with the deposition chamber pressure in the range of 50–100 Torr. Suppression of nucleation is carried out by raising the substrate temperature to at least 1000° C. The density of nucleation can be varied by varying the temperature of the substrate within such range or by varying the roughness and defect sites in the substrate surface.

The tool substrate is preferably selected to retain strength related properties (i.e., fracture toughness and thermal shock resistance) after exposure to temperatures of up to 1050° C. for 20 hours; the substrate preferably is selected from the group consisting of SiAlON, $Si_3N_4$, SiC, W, Si, Ti, Co cemented WC, TiC, Ni-Mo alloy cemented TiCN. The binding material is a refractory carbide former and is preferably selected from the group consisting of Ti, Ni, Co, Mn, Cr, Mo, W, Zr, Ta, Si, Hf, and Fe, and may contain an agent to promote brazement (i.e., Cu, Ag, Sn). Thus, a binding material is preferably an alloy family such as Ti-Ni-Sn, or Ni-Mn-Sn-Ti. Adherence of the binding material is obtained by mechanical impingement from physical vapor deposition techniques or by time restricted heating to effect a braze. The rate at which the diamond or diamond-like particles on the substrate is cooled, preceding the addition of the binding material, to evolve hydrogen, is preferably about 1° C./minute at $10^{-3}$ Torr. If heating is used to effect a quick brazement, slow cooling from the brazing temperature is employed, which promotes an increased mechanical bonding by shrinkage.

SUMMARY OF THE DRAWINGS

FIG. 1 is a flow diagram of the process steps of this method invention;

DETAILED DESCRIPTION AND BEST MODE

Figure 2A:
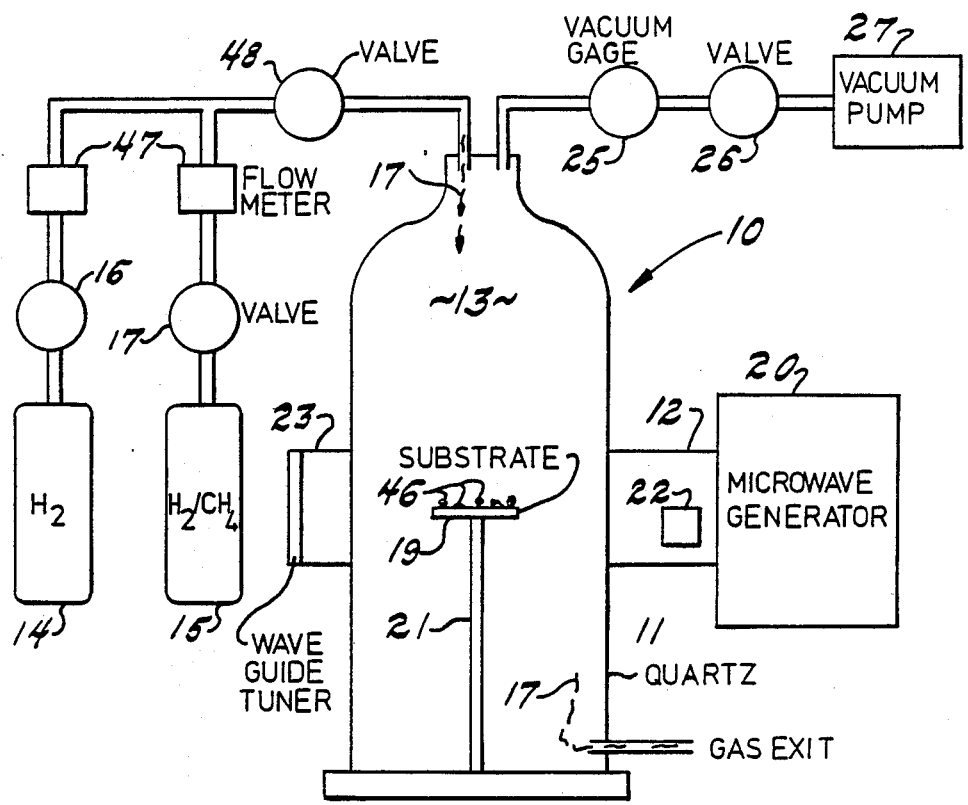
FIG. 2a is a diagramatic illustration of apparatus useful in carrying out the chemical vapor deposition portion of the invention herein by microwave plasma discharge.

The method and structure of this invention provide a diamond or diamond-like coated tool surface which overcomes mechanical weakness of the coated structure by exploiting a noncontiguous metastable low pressure deposition of diamond or diamond-like particles with a post-diamond deposition of a diamond and tool surface binding material, thereby producing a composite tool surface equivalent to polycrystalline diamond compacts produced by high temperature and high pressure.

Before proceeding with explanation of the detailed process, it is of some importance to define the structure of diamond particles and diamond-like particles, and to explain what is meant by metastable molecular processes during low pressure diamond growth.

A diamond particle is a special cubic lattice grown from a single nucleus of four-coordinated carbon atoms. The diamond-cubic lattice consists of two interpenetrating face-centered cubic lattices, displaced by one quarter of the cube diagonal. Each carbon atom is tetrahedrally coordinated, making strong, directed $sp^3$ bonds to its neighbors using hybrid atomic orbitals. The lattice can also be visualized as planes of six-membered saturated carbon rings stacked in an ABC ABC ABC sequence along <111> directions. Each ring is in the "chair" conformation and all C—C bonds are staggered.

A lattice with hexagonal symmetry, lonsdaleite, can be constructed with the same tetrahedral nearest neighbor configuration. In lonsdaleite, however, the planes of chairs are stacked in an AB AB AB sequence. The C—C bonds normal to these planes are eclipsed. In simple organic molecules, the eclipsed conformation is usually less stable than the staggered because steric interactions are greater.

Thermodynamically, diamond is slightly unstable with respect to crystalline graphite. At 298 K and 1 atm the free energy difference is 0.03 eV per atom, only slightly greater than kT (here k is the Boltyman Constant and T is the absolute temperature). Diamond has the highest atom number density of any material at terrestrial pressures. As a result of its high atom-number density and the strong covalent bonding, diamond has the highest hardness and elastic modulus of any material and is the least compressible substance known. The thermal conductivity of diamond at 300 K is higher than that of any other material and its thermal expansion coefficient at 300 K is $0.8 \times 10^{-6}$, lower than that of Invar.

Diamond-like hydrocarbons are essentially diamond with approximately 0.2–0.6 atom fraction hydrogen; density increases with hydrogen content contrary to conventional hydrocarbons (always greater than 0.19 gram-atom per cubic centimeter). Diamond-like hydrocarbons have hydrogen to stabilize the $sp^3$ sites; such hydrocarbons have microhardness values of 3000–5000 kg mm$^{-2}$, compared to 2000–3500 kg mm$^{-2}$ for SiC. The hardness of diamond-like hydrocarbons drops off markedly as the hydrogen content increases.

Diamond-like carbons are essentially carbon with some $sp^3$ bonding and with little or no hydrogen; they have atom number densities from 0.17 to 0.28 gram-atom per cubic centimeter. Such carbons utilize their medium or long range order to stabilize the $sp^3$ carbon sites and approach the physical properties of diamond.

NATURE OF LOW PRESSURE DIAMOND GROWTH

Metastable diamond growth at low pressures is of relatively recent origin. Techniques for growing diamond metastably may be conveniently divided into three categories: hot filament chemical vapor deposition (HFCVD); high frequency plasma-assisted chemical vapor deposition (PACVD); and DC plasma discharge. Hybrid techniques, for example, hot filaments immersed in a plasma discharge, have also been used.

In HFCVD, a tungsten filament or foil at 2000 to 2800 K is used to dissociate gas mixtures containing from 0.2 to 2.0% CH$_4$ in H$_2$, typically at about 50 Torr but also up to atmospheric pressure. The dissociation products at these temperatures consist mainly of radicals, for example, CH$_2$, C$_2$H, and CH, acetylene, and atomic hydrogen, as well as unreacted CH$_4$ and H$_2$. Filaments of W, Ta, and Mo have been used to produce diamond. The filament is typically placed with 1 cm of the substrate surface to minimize thermalization and radical recombination. However, radiation heating can produce excessive substrate temperatures leading to nonuniformity and even graphitic deposits. Withdrawing the filament slightly and biasing it negatively to pass an electron current to the substrate assists in preventing excessive radiation heating.

Microwave and RF (radio frequency) methods in which the substrate is removed from the plasma can be used. Diamonds can be grown in microwave discharges in a magnetic field, under conditions where electron cyclotron resonance is considerably modified by collisions. These "magneto-microwave" plasmas can have significantly higher densities and electron energies than isotropic plasmas and can be used to deposit diamond over large areas.

The basic obstacle to crystallization of diamond at low pressures is the difficulty in avoiding codeposition of graphite and/or amorphous carbon when operating in the thermodynamically stable region of graphite. In general, the possibility of forming different bonding networks with carbon atoms is understandable from their ability to form different electronic configurations of the valence electrons. These bond types are classified as $sp^3$, $sp^2$, $sp^1$ and are related to different carbon allotropes, diamond and lonsdaleite, graphite, and carbenes, respectively.

In heterogenous decomposition reaction of CH$_4$ on a substrate occurring under thermal equilibrium at about 900° C. and at a pressure less than 50 Torr, deposition of diamond will start at the edge or step on a face where the crystal field is especially strong when the equilibrium concentration of carbon atoms or hydrocarbon molecules is exceeded. The process continues until the surplus of carbon atoms is consumed. Building diamond on diamond is called homoepitaxy or autoepitaxy; on nondiamond substrates, the growth is heteroepitaxial or nonepitaxial. The formation of a nucleus of critical size emerges as a result of a balance between contributions from volume and surface energies. In general, this balance is dependent on fluctuations in the chaotic motion of atoms. Exceeding a critical size is necessary before stable growth of the new phase will occur, and there is a finite probability for this event. The number of nuclei will depend on temperature, supersaturation, and state (structure, roughness, etc.) of the substrate.

Metastable synthesis of diamond must control the deposition process in such a way that subcritical nuclei of diamond (the metastable phase) will grow above the critical size necessary to stabilize further growth, but simultaneously to prevent subcritical nuclei of graphite (the thermodynamically stable phase) from achieving critical size. Success of diamond synthesis far from the equilibrium conditions depends on finding crystallization conditions for the metastable phase when growth of the stable phase (graphite) has been stopped. Use of hydrogen makes possible low pressure gas phase crystallization of diamond.

In the presence of atomic hydrogen, the principal surfaces of diamond are likely to be saturated with hydrogen. Because the H—H bond energy is greater than the C—H bond energy, atomic hydrogen will both add to vacant surface sites, S·, and abstract hydrogen from filled sites, S—H

   (1)

   (2)

Reactions 1 and 2 are exothermic. The required energy is supplied by the energy added to dissociate H$_2$ (H$_2 \rightarrow$ 2H·). Because of the dynamic interaction between atomic hydrogen and the surface, there will be a steady-state concentration of free surface sites, S·, which can undergo reactions with carbon-containing species, R, for example,

   (3)

The nature of the growth sites can be either intermediate for diamond growth that is a single-carbon-atom species (for example, involving CH$_3$ radicals and CH$_3$ ions) or a two-carbon-atom species (for example, acetylene). It has been shown that the growth rate by thermal CVD was first order in methane partial pressure and one-half order in ethylene partial pressure. This result is strong evidence that one step in these experiments involved a single-carbon-atom species but does not preclude the easy addition of acetylenic species in later steps.

Plasma chemistry can affect the deposit in other ways. For example, at low pressures the dissociation of $H_2$ ($H_2 \rightarrow 2H$) increases, and the population of excited hydrogen (H*) increases as well. The level of ionization increases because a major ionization channel is through excited states. Consequently, the ratio of ion to neutral fluxes at the substrate increases. In DC plasmas, ion bombardment at the cathode is enhanced. Highly exothermic reactions at the substrate may contribute to graphitization. Excited-state hydrogen may contribute to dissociation through de-excitation processes.

NONCONTIGUOUS GROWTH

In the method hereof, low pressure chemical vapor deposition is carried out by biasing the free energy of a hydrogen-hydrocarbon gas mixture, surrounding the tool substrate, to form atomic hydrogen and deposit diamond or diamond-like particles with $sp^3$ bonding. The nucleation of such particles is controlled either in a heterogeneous manner through the use of diamond seed particles, or homogeneously through carburization nucleation. Carburization nucleation is clearly preferred because seeding tends to promote slightly more rapid lateral growth, and seeded depositions on TiC or Co cemented WC may not permit fully adherent coatings to be formed. In either case, the nucleation phase of the diamond or diamond-like growth is controlled and limited so as to ensure noncontiguous diamond particles. For purposes of this invention, diamond particles are clearly preferred because diamond-like depositions are more likely to form a continuous film rather than nucleate and grow as separated crystallites.

Once nucleation of the particle deposition process has been established by seeding or by carburization of the substrate to a desired density, nucleation is suppressed or stopped by raising the temperature of the substrate to a point at which such suppression occurs and growth of existing particles becomes the dominant feature of the deposition process. The exact temperature for onset of this behavior is a complex function of substrate materials, gas phase composition, and conditions within either the hydrocarbon plasma or high temperature vapor stream, but will generally be about 1000° C.

With the diamond crystal particles in a noncontiguous condition, the use of a metallized coating thereover secures the diamond particles not only to the binder, but the binder may promote a brazement between the substrate, diamond, and binder, thereby providing additional mechanical stability limiting fracture or deadhesion of the diamond particles from the tool surface.

As shown in FIG. 1, the method of making diamond composite coated tools comprises essentially three steps. In the first step, a tool substrate is selected from materials that can retain the necessary strength related physical properties after exposure to processing temperatures of CVD, such as up to 1050° C. for 20 hours. In this step, CVD is initiated to form an array of separated diamond particle nuclei onto the tool substrate by use of low pressure metastable gas phase deposition. This involves biasing the free energy of a hydrogen-hydrocarbon gas mixture surrounding the substrate to form atomic hydrogen and thereby deposit diamond nuclei under metastable conditions. To favor nucleation only, the substrate temperature is maintained in the range of 600°–950° C. and advantageously to attain a nuclei or particle density of one particle per 100 $\mu m^2$.

In the second step, CVD is interrupted before formation of a contiguous crystal film by raising the temperature of said surrounding gas to stimulate crystal growth of said array of separated crystal nuclei and cease crystal seeding. To substantially suppress nucleation the temperature of the substrate must be raised to a temperature of at least 1000° C. The raised temperature is continued until the particles attain a desired size, preferably up to 10 microns and at a growth such as at a desired rate of 3–5 $\mu$m/hr. As part of this step, the coated substrate may be cooled to evolve hydrogen therefrom. In the last step, a mechanically tough metallized material layer, adherent to both the diamond and the substrate, is deposited on and across the array of separated diamond crystals and exposed substrate spaces in a thickness of up to the height of the diamond crystals. The binding material contains a brazing agent which, when heated during the binder deposition or subsequent thereto, forms a chemical and mechanical bond between the diamond crystals and substrate.

The substrate materials which have been shown to retain strength related properties and support the diamond growth process at elevated temperatures, include: diamond, silicon carbide, silicon, titanium, cobalt cemented tungsten carbide, titanium carbide, nickel-molybdenum alloy cemented titanium carbonitride, silicon nitride, and various members of the SiAlON family of silicon nitride/alumina mixtures. The necessary strength related physical properties which the tool substrate must possess usually include high fracture toughness and high thermal shock resistance.

CVD is preferably assisted and carried out by microwave plasma discharge apparatus 10 as shown in FIG. 2a. A quartz tube 11 is set across a microwave guide tube 12 which serves as the plasma deposition furnace or chamber 13. Hydrogen and methane are used as reactants supplied from tanks 14 and 15. The reactants were controlled by valves 16 and 17 to achieve a predetermined gas mixture 18 with methane constituting 0.5–2.5 volume percent and the remainder essentially hydrogen; the gas mixture was controlled to a flow rate through the chamber of about 60–100 sccm during active deposition. Microwave plasma was generated to heat the gas mixture 17 in the chamber and a substrate 19 placed therein. A microwave power supply 20 of 2.45 gigahertz (GHz) rating was used with actual power at about 300–500 watts. The microwave plasma is created by the guide tubes 12, a power monitor 22, and a tuner 23. After tuning, the plasma will be confined to the center of the quartz tube 11. The substrate or tool insert is secured to a holder 21 and susceptor comprised of boron nitride or graphite. The pressure control system 24 has a pressure gauge 25, valve 26, and a vacuum pump 27 to achieve chamber pressures of 1–110 Torr. Diamond deposition predominates at pressures above 4 Torr; pressures useful for low pressure metastable CVD are preferably in the 30–100 Torr range and optimally about 80–90 Torr.

Nucleation of separated diamond or diamond-like particles is assured by (i) maintaining the substrate temperature in the range of 600°–950° C., (ii) controlling the substrate surface roughness to be no finer than a predetermined amount, and (iii) limiting deposition time to prevent particle size growth up to a predetermined maximum to prevent becoming contiguous. Treating or polishing the substrate surface with hard powder (diamond or SiC powder) in the particle size range of #100–1000 may give lower density nucleation; abrading may influence the sites for nucleation and seeding density will do the same. However, by limiting the nucleation deposition time to typically 4–10 hours, the density of about one particle per 100 $\mu m^2$ of substrate surface can be achieved. The higher the temperature within the nucleation temperature range of 600°–950° C., the higher the density of nucleation; the lower the temperature within such nucleation. Thus, controlling the temperature, as well as treating the substrate surface, offers control of nucleation density to assure separation of most particles.

Figure 2B:
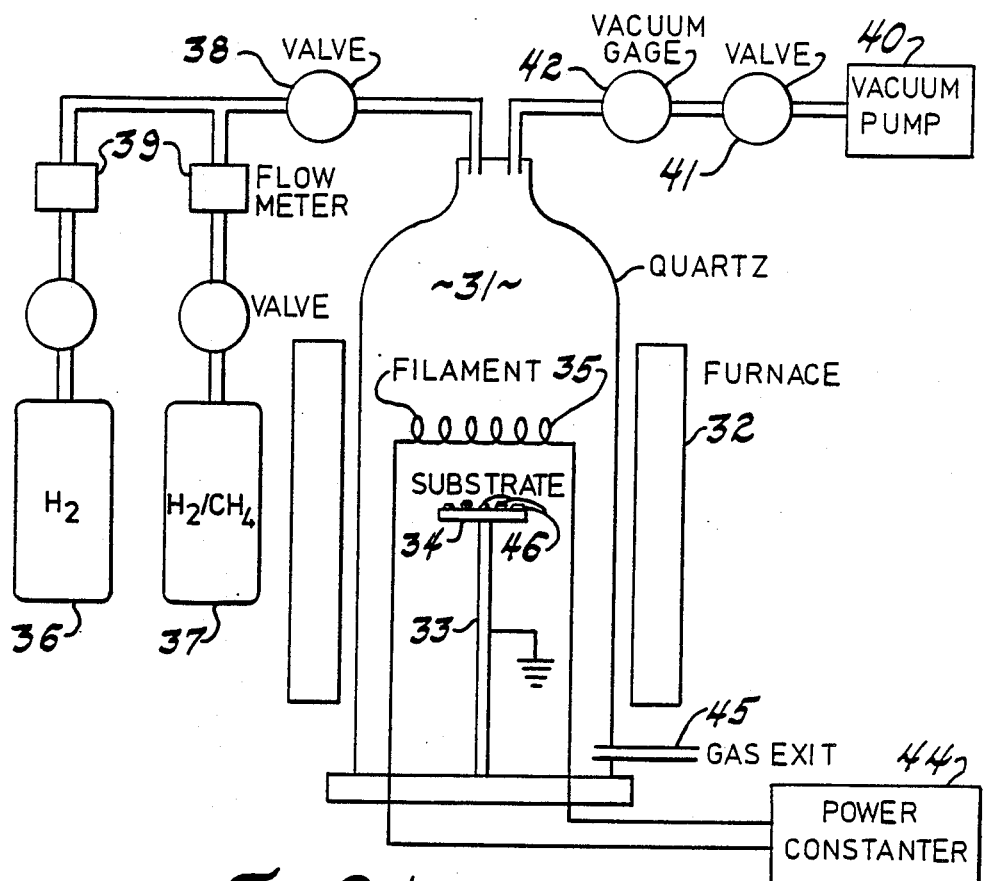
FIG. 2b is a diagramatic illustration of apparatus useful in carrying out chemical vapor deposition by hot filament.

Low pressure chemical vapor deposition can also be carried out with the use of apparatus such as shown in FIG. 2b. The reactor assembly 30 includes a reaction chamber 31, a furnace 32, a support 33 for a tool substrate 34, and a filament 35 for assisting the heating of the substrate surface to be coated. The gas supply is provided with separate canisters 36, 37 of relatively pure hydrogen, and a mixture of hydrogen and methane with the methane being restricted to a percentage of about 0.5–2.5% by volume. The gas flow from the canisters is admitted by way of a needle valve 38 or electronic mass-flow controller which controls the flow to that desired, utilizing flow meters 39. The pressure of the reaction chamber 31 is controlled by use of a vacuum pump 40 which in turn is controlled by use of a needle valve 41 operated in response to the degree of vacuum indicated by a gauge 42.

Preferably, conditions for stimulating the nucleation of noncontiguous diamond or diamond-like crystals by filament assisted CVD, include: a temperature for a tantalum filament of about 1800° C., temperature for the substrate of about 600°–950° C., a gas pressure of at least 5 Torr, a gas composition of 0.5% $CH_4$, with the balance $H_2$, and total gas flow rate of 30 sccm, and a deposition time of about 5–22 hours. The tantalum filament is heated by an AC source and placed above the substrate, which preferably is cleaned ultrasonically in acetone. After flushing the reaction chamber with pure hydrogen and heating the electric furnace to the selected deposition temperature, the tantalum filament is switched on and the reaction gas introduced for the selected deposition time. The substrate temperature is monitored by a suitable thermocouple placed beneath the substrate and the filament temperature is measured by an optical pyrometer.

It may be possible to alternatively place the substrate on an externally powered heating platen such that power (heat) may be applied to the substrate independent of plasma power or filament temperature.

SUPPRESSION AND GROWTH

The exact temperature at which nucleation yields to crystal growth is a complex function of substrate material, gas phase composition, and conditions for either the hydrocarbon plasma or high temperature vapor stream, but will generally be near 1000° C. (i.e., 975°–1025°). The conditions to promote crystal growth and cessation of the nucleation consist of changing the temperature of the substrate to at least about 1000° C. by increasing the microwave plasma discharge or by increasing the filament temperature (to i.e., 2300° C.). This interrupts the conditions necessary for nucleation.

In order to minimize deadherence of the diamond particles at the post-diamond deposition phase of processing, due either to thermal expansion coefficient mismatch or by action of entrained hydrogen gas from the plasma or vapor process, the substrate is then cooled from the deposition temperature and conditions of high vacuum such that the evolution of entrained hydrogen from the substrate is promoted. Preferably, the cooling rate is about 1° C./minute under a vacuum of at least $10^{-3}$ Torr.

BINDING MATERIAL

The binding material is applied to the tool surface for the purpose of providing a binder that aids in securing the diamond or diamond-like particles to the substrate and to provide the additional mechanical stability by a continuous solid film or coating which absorbs shock during a cutting operation and limits the fracture or deadhesion of the diamond particles from the tool surface. Choice of the binder material will depend on the specific substrate. The binder phase will be chosen with the following properties: (i) adhesion to and wetting of the substrate material at both elevated and ambient temperatures, (ii) adhesion to diamond grains on the surface of the substrate, and (iii) resistance to cracking and spallation during subsequent metal cutting or forming operations. Binder alloys for diamond-metal composites may be comprised from the group including titanium, nickel, cobalt, manganese, chromium, molybdenum, tungsten, zirconium, tantalum, hafnium, silicon, and iron. The vaporization temperatures of each of the elemental metals is exceedingly high, all above 1200° C.; at such high temperatures for a prolonged period, the diamond particles would be graphitized or dissolved and the substrate detrimentally affected. Thus, such binding material cannot be deposited by CVD unless the material can be deposited at a temperature under 500° C. Very few crack-resistant materials are known which can be deposited by CVD at under 500° C. and even fewer which can be effectively adhered to diamond or diamond-like particles and to the substrates contemplated herein. The metals designated above, or their alloys, not only can be deposited by low temperature techniques but can also be impinged or shrunk onto the diamond coated substrate to offer unprecedented adherence.

Several methods can be used for application of the selected metal binding materials to the surface of the diamond particle-coated tool surface. The first involves physical deposition of a uniform metal film by sputtering at ambient temperatures, such that the alloy composition is evolved from an alloy or elemental metal target. Metallic binding particles of a particular alloy composition can also be fabricated by powder metallurgy techniques for alloyed powders; they are deposited on the tool surface by atomization from a suspension in an inert vehicle or by electrophoretic deposition (powder particles are supported in a dielectric media in which they are attracted to the workpiece or tool surface held cathodically in the medium). In certain instances, the binding material can be deposited electrolytically from a solution or through use of certain electroless deposition schemes. However, these latter techniques are limited by the latitude of compositions that can be used.

Binding materials useful for this invention also include brazing agents that lower the melting temperature of the metal or alloyed binding material; agents that permit brazements to be obtained at temperatures significantly below those at which the above-mentioned binding materials will melt may include copper, silver, and tin. Examples of alloy families that can be brazed are Ti-Ni-Cu and Ni-Mn-Sn-Ti. A general limitation on the temperature of forming brazements, however, will be determined by the graphitization or dissolution of the diamond particles and rates at which this occurs relative to the braze or wetting process. The graphitization of diamond is determined to a degree by the metal or alloy with which it is in contact. As part of this invention, it has been discovered that if the heating for brazing is maintained at a temperature in the range of 900°–990° C. and limited to a time period of 1–3 minutes, graphitization or dissolution will not take place to any significant degree to affect the coated composite.

Heating to form a chemical and mechanical bond between the brazable alloy binding material and the diamond coated substrate can be carried out simultaneous with the deposition of the binding material or subsequent thereto. This involves the formation of an adherent bond between the binder metal, diamond particles, and tool substrate material through high temperature brazing in either high vacuum or under such reducing conditions which permit local oxide or passivating films to be dissipated or rendered noninterfering to contact by the binder material. In certain instances it will be possible to incorporate oxygen gettering elements (e.g., Ti, Zr, Al, Si) into the alloy metal of the binding material such that melting will provide a source of the getter.

Where diamond particles remain covered by the binding material, it is expected that such material will be readily abraded on a "break-in" phase of machining or grinding exposing the embedded diamond particles.

EXAMPLES

For purposes of the best mode, a substrate tool material is chosen to be nickel-molybdenum cemented titanium carbonitride, diamond honed to its final configuration. The tool is cleaned in an organic solvent such as acetone prior to its insertion in a deposition chamber for application of the diamond particles.

Figure 4:
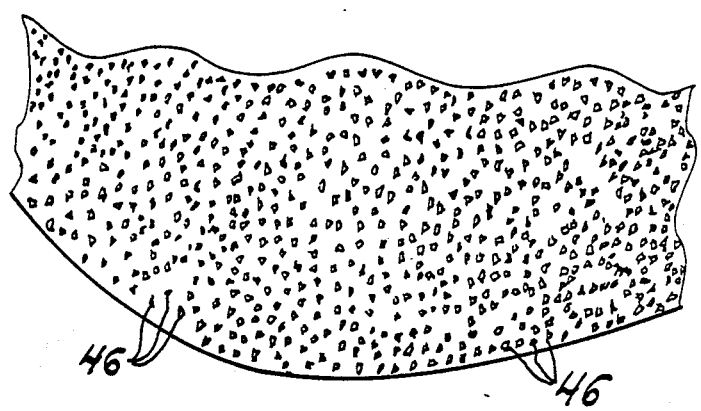
FIGS. 4 and 5 are facsimilies scanning electron photomicrographs of separated diamond particles on a tool substrate, respectively at 50X and 3800X magnification.
Figure 5:
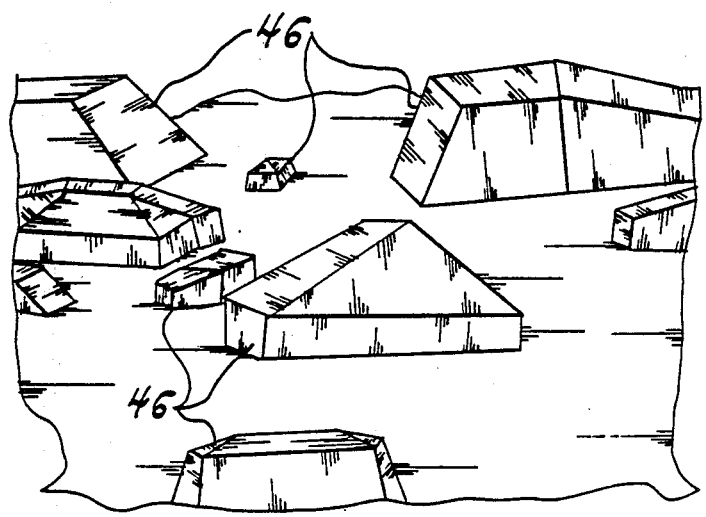
Figure 3A:
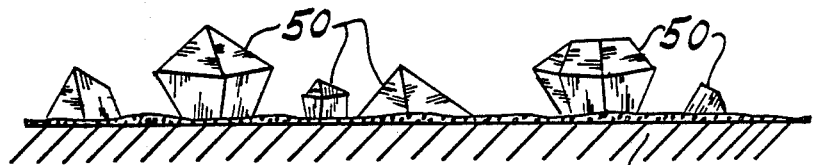
FIG. 3a is a schematic illustration of the noncontiguous (separated) diamond particles deposited on a tool substrate and grown in accordance with a first stage of this invention.

Diamond particles of approximate size of 10 microns in diameter are grown by a process of microwave plasma deposition at a frequency of 2.45 GHz in a reactor operating at 90 Torr total pressure of methane in hydrogen at a methane concentration of 1% at a first stage of 900° C. and a second stage at 1000° C. with total flow rate of 100 standard cubic centimeters per minute. The deposition time is on the order of 2–4 hours for the first stage and another 1–4 hours for the second stage. The condition of the nucleated and grown particles 50 on substrate 49 after stage 2 is schematically shown in FIG. 3A and by facsimile SEM in FIGS. 4 and 5. At the conclusion of the deposition step, the substrate is permitted to slow cool to room temperature under vacuum at least at a pressure $10^{-4}$ Torr to permit hydrogen degassing of the substrate.

Figure 3B:
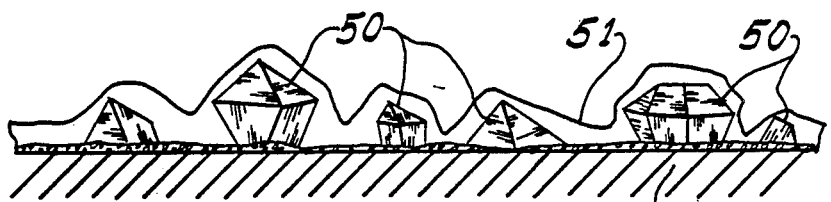
FIG. 3b is a schematic illustration of a binding layer deposited over the noncontiguous diamond particles of FIG. 3a to complete the composite coated tool substrate.

The binder film is applied to the diamond particle/tool assembly by the process of magnetron sputtering from an alloy target of composition 64.8% titanium, 25.2% nickel, and 10% copper. A film 51 of approximately 10 microns is applied to the tool (as shown schematically in FIG. 3B). Following deposition of the metallized layer, the assembly is reheated in a vacuum to a temperature of approximately 900° C. at which point the binder alloy is molten and is secured to both the diamond and carbide tool substrate. Again, the tool assembly is slowly cooled to permit degassing of the surface layer.

ADHERENCE TESTS

The adherence of noncontiguous diamond particles produced by microwave-enhanced CVD, accompanied by a binding overlayer, was assessed by machining data on aluminum alloys. In the machining tests, several cutting tools or inserts were employed for comparisons. Uncoated ceramic substrates were used, one consisting of Co cemented WC, and the other SiAlON. Coated substrates consisted of (i) a contiguous diamond low pressure CVD film on SiAlON, (ii) a compacted polycrystalline diamond coating by high temperature and high pressure on diamond, and (iii) noncontiguous diamond low pressure CVD particles with an overlay of a binding layer in accordance with this invention.

The contiguous diamond low pressure CVD film on a SiAlON substrate was formed of a typical commercial grade configured in SNG 432 tool geometry. The substrate was polished prior to CVD by use of a sequence that concluded with 3 $\mu$m diamond paste. The diamond coating was seeded by use of light polishing with 0.25 $\mu$m diamond paste followed by rinsing in methanol. The only heat supplied to the substrate during deposition was via coupling to the microwave power, which was adjusted to yield a specimen temperature at the growth surface of 1000° C. as measured by optical pyrometry through a window in the growth tube. The system pressure was maintained at 90 Torr with total gas flow rate of 100 sccm. The feed gases were $CH_4/H_2$ mixtures at 1% or 2% methane. Total growth times were typically five hours, including nucleation time.

The coating of noncontiguous low pressure CVD diamond particles with the binding layer was on a Ni-Mo cemented TiCN substrate, deposited at conditions described in the preferred embodiment described earlier.

Cutting tests on aluminum-silicon alloys were performed in both turning and milling operations. Such tests reproduce the stress and temperature conditions experienced by cutting tools in actual practice. Turning studies were first conducted on an 8" diameter "log" of AA 333 aluminum (8–10% Si, 3–4% Cu) at speeds of 1000 and 2000 sfpm, with feeds of 0.014 and 0.007 ipr respectively, and 0.040" depth of cut. Uncoated SiAlON was used as a reference material. The resulting surface finish from the contiguous coated SiAlON tool was not much better (49–52 microinches) than for the uncoated SiAlON reference (88–92 microinches) after 30 minutes of cutting at 2000 sfm.

Figure 6:
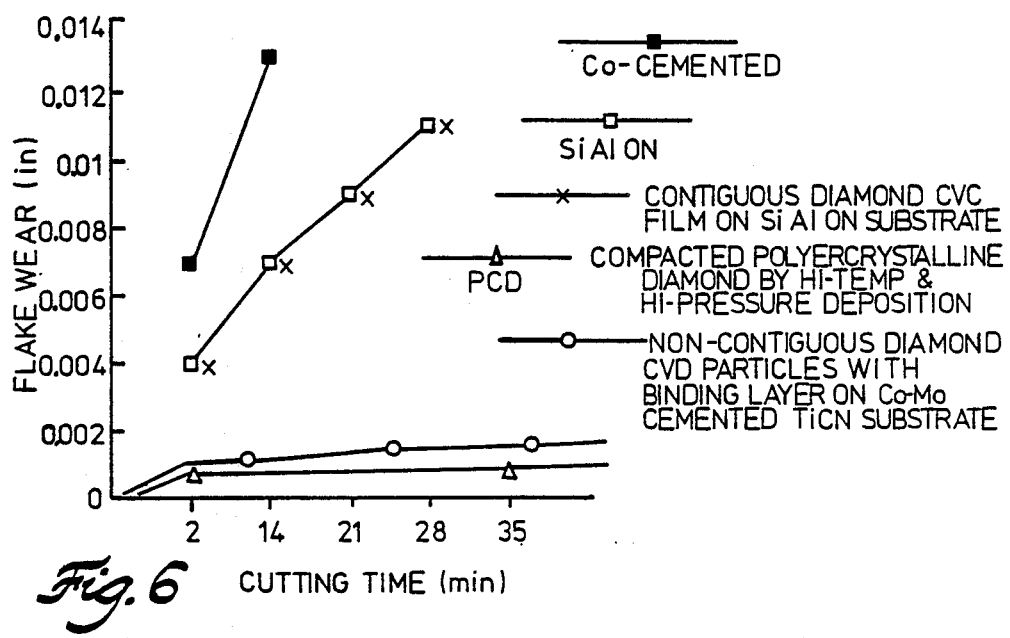
FIG. 6 is a graphical illustration of flank wear as a function of time as another indicator of coating adherence.

Milling tests were then conducted on a more difficult to machine alloy, AA 390 aluminum (nom. 16–18% Si, 4–5% Cu), at speeds of 544 and 1171 sfpm, with tool feed rate of 0.008 ipr and 0.060" depth of cut. FIG. 6 shows the progression of flank wear for the various tools used; tool wear data for a C2 cobalt cemented tungsten carbide and compacted polycrystalline diamond (PCD) is shown for comparison. These wear tests show that contiguous films of diamond particles on SiAlON is no better than uncoated SiAlON. However, the projected data for noncontiguous (low pressure CVD) diamond particles with a binder overlay provides a flank wear rate that may approach that of polycrystalline diamond deposited at high pressures and temperatures.

While particular embodiments of the invention have been illustrated and described, it will be obvious to those skilled in the art that various changes and modifications may be made without departing from the invention, and it is intended to cover in the appended claims all such changes and equivalents that fall within the true spirit and scope of the invention.

What is claimed:

1. A method of making a composite coated article by the steps of:
   (a) initiating chemical vapor deposition of separated diamond or diamond-like particles onto a nondiamond or nondiamond-like substrate surface by use of low pressure metastable deposition of carbon in the presence of atomic hydrogen and at a temperature that favors the nucleation of such particles, the substrate being selected to facilitate such diamond or diamond-like deposition and to retain its strength related properties after said chemical vapor deposition;
   (b) substantially suppressing nucleation of additional particles before formation of a contiguous film of said particles while permitting the existing particles to grow to a predetermined maximum crystal size consistent with separated crystals; and
   (c) adhering a mechanically tough diamond and substrate-wetting, metal binding material onto and across said separated particles and exposed substrate surface to form the composite coated article with little or no graphitization or dissolution of said particles.

2. The method as in claim 1, in which said chemical vapor deposition of step (a) comprises thermal decomposition of a hydrocarbon gas containing hydrogen, and step (c) comprises physical deposition at a substrate temperature that does not exceed 500° C. for longer than three minutes.

3. The method as in claim 1, in which said particles of step (a) are heterogeneously arranged as a result of diamond seeding to carry out chemical vapor deposition.

4. The method as in claim 1 in which said particles of step (a) are homogeneously arranged as a result of carburizing nucleation to carry out chemical vapor deposition, each nucleus comprising four-coordinated carbon atoms with $sp^3$ bonding.

5. The method as in claim 2, in which thermal decomposition is facilitated by filament heating.

6. The method as in claim 2, in which thermal decomposition is facilitated by plasma discharge.

7. The method as in claim 1, in which said temperature favoring nucleation is in the range of 600°–950° C. with said low pressure being in the range of 50–100 Torr.

8. The method as in claim 1, in which said binding material is a refractory carbide former.

9. The method as in claim 1, in which said article is a cutting tool.

10. The method as in claim 1, in which suppression of step (d) comprises raising the temperature of said substrate during chemical vapor deposition to at least 1000° C.

11. The method as in claim 1, in which said maximum crystal size of step (b) is about 10 microns.

12. The method as in claim 11, in which the density of the grown particles is generally limited to a density of about one particle per 100 $\mu m^2$.

13. The method as in claim 1, in which said substrate is selected from the group consisting of $Si_3N_4$, SiAlON, SiC, Si, W, Ti, Co cemented WC, and TiC, Ni-Mo alloy cemented TiCN.

14. The method as in claim 1, in which said binding material is selected from the group consisting of Ti, Ni, Co, Mn, Cr, Mo, W, Zr, Ta, Si, Hf, and Fe.

15. The method as in claim 1, in which said binding material comprises an agent to make the material more brazeable at lower temperatures.

16. The method as in claim 15, in which said brazing agent is selected from the group consisting of Cu, Ag, and Sn.

17. The method as in claim 1, in which said binding material is an alloy selected from either Ti-Ni-Cu or Ni-Mn-Sn-Ti.

18. The method as in claim 1, in which said binding material is deposited by sputtering, vaporization, atomized powder metal, electrophoretic deposition, electrolytic solution deposition, or electroless metal solution deposition.

19. The method as in claim 1, in which the density of nucleation of step (a) is reduced by controlling the substrate temperature during CVD to the lower end of the temperature range of 600°–950° C. and/or by treating the surface of the substrate to have less defect sites.

20. A method of making a diamond composite coated tool, comprising the steps of:
   (a) providing a tool substrate selected from materials that retain at least 90% of their strength related properties after exposure to processing temperatures up to 1050° C. for up to 20 hours;
   (b) initiating chemical vapor deposition of substantially separated single crystal diamond nucleation particles onto a surface of said substrate, said deposition being (i) by use of a low pressure surrounding gas containing about 1% by volume methane and the remainder essentially hydrogen, (ii) at a substrate temperature of 800°–950° C., and (iii) for a period of 2–4 hours;
   (c) substantially suppressing further nucleation of additional particles before formation of a contiguous film of said particles by increasing the substrate temperature to a temperature of 1000° C. or greater for a period of 1–4 hours that permits the existing particles to grow to a crystal size consistent with said separation;
   (d) tooling said coated tool substrate under vacuum to evolve hydrogen from the tool substrate;
   (e) depositing a mechanically tough, diamond and tool wetting material onto and across said separated particles and exposed substrate surface, said deposited material comprising an alloy selected from the group consisting of the alloy families of Ti-Ni-Cu and Ni-Mn-Sn-Ti; and
   (f) either during step (e) or thereafter, heating said deposited material to form a chemical and mechanical bond with diamond and tool substrate.

21. The method as in claim 20, in which said substrate material is Ni-Mo cemented TiCN.

22. The method as in claim 20 in which said deposition is carried out by microwave plasma deposition at a deposition chamber pressure of about 50–100 Torr.

* * * * *